US012683620B2

(12) United States Patent
Billa et al.

(10) Patent No.: US 12,683,620 B2
(45) Date of Patent: Jul. 14, 2026

(54) CURRENT STEERING DIGITAL-TO-ANALOG CONVERTER WITH REDUCED INTER-CELL INTERFERENCE

(71) Applicant: MEDIATEK INC., Hsin-Chu (TW)

(72) Inventors: Sujith Kumar Billa, Hsinchu City (TW); Sung-Han Wen, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 130 days.

(21) Appl. No.: 18/822,479

(22) Filed: Sep. 3, 2024

(65) Prior Publication Data

US 2025/0080128 A1 Mar. 6, 2025

Related U.S. Application Data

(60) Provisional application No. 63/580,404, filed on Sep. 4, 2023.

(51) Int. Cl.
H03M 1/08 (2006.01)
H03M 1/74 (2006.01)
(52) U.S. Cl.
CPC ......... H03M 1/0827 (2013.01); H03M 1/747 (2013.01)

(58) Field of Classification Search
CPC ........................... H03M 1/0827; H03M 1/747
USPC ................................................... 341/136, 144
See application file for complete search history.

(56) References Cited

U.S. PATENT DOCUMENTS

| | | | |
|---|---|---|---|
| 6,809,673 B2 | 10/2004 | Scanlan | |
| 7,629,910 B2 * | 12/2009 | Ramadoss | H03M 1/0881 341/144 |
| 8,441,382 B2 * | 5/2013 | Mahajan | H03K 17/063 341/144 |

* cited by examiner

*Primary Examiner* — Khai M Nguyen
(74) *Attorney, Agent, or Firm* — Winston Hsu

(57) ABSTRACT

A DAC cell circuit includes: at least a DAC cell, including: a first MOSFET having a drain coupled to a first switch for receiving a first current and coupled to a second switch for generating a second current, a source coupled to ground, and a gate coupled to a first bias voltage; a capacitor coupled between the gate and the drain of the first MOSFET; and a dead-band switch coupled between the gate of the first MOSFET and the bias node. The dead-band switch is controlled by a signal which is periodic with respect to a frequency equal to an input data rate of the DAC cell, and the dead-band switch is open during a data transition.

14 Claims, 23 Drawing Sheets

CURRENT STEERING DIGITAL-TO-ANALOG CONVERTER WITH REDUCED INTER-CELL INTERFERENCE

CROSS REFERENCE TO RELATED APPLICATIONS

This application claims the benefit of U.S. Provisional Application No. 63/580,404, filed on Sep. 4, 2023. The content of the application is incorporated herein by reference.

BACKGROUND

The invention is directed to a current steering Digital-to-analog Converter (DAC), and more particularly, to a current steering DAC which has reduced inter-cell interference.

DAC is a data converter which receives a digital input and generates an analog output. DACs are commonly used in music players to generate an analog audio output from a digital data stream, as well as in televisions and mobile phones to generate an analog video output from digital video data. DACs used for video output are typically high frequency devices with low to medium resolution whereas DACs used primarily for audio output are typically low frequency devices with high resolution.

FIG. 1 illustrates a single DAC cell 100 comprising a first switch $P_{(i)}$, a second switch $N_{(i)}$, a capacitor, and a tail transistor/MOSFET $Mn_{(i)}$. The capacitor and MOSFET are coupled to a bias line at a common bias node which receives a bias voltage $V_{NBias}$. Note that the switches in FIG. 1 are illustrated as simple switches but can be implemented by any structure such as MOSFETs. The capacitor represents the gate-to-drain capacitance. The bias voltage dictates the current of the DAC cell 100.

The input of the DAC cell 100 is a digital sequence which, when passed through the DAC cell, should be represented at its output as an analog equivalent of the input sequence. The inputs to the switches are binary (i.e. 0 or 1), and open and close such that when $P_{(i)}$ receives a positive input or 1, $N_{(i)}$ receives a negative input or 0 and vice versa. When the inputs to the switches change, the DAC cell 100 will undergo a transition. All DAC cells will have some non-ideal transient behavior such as a finite settling time and asymmetric rise and fall times, and non-ideal static behavior such as a transfer function deviating from a straight line.

FIGS. 2A~2C show the DAC cell 100 undergoing an input data change from $D_{(i)}$=+1→−1. In FIG. 2A, switch $P_{(i)}$ is closed and switch $N_{(i)}$ is open. In FIG. 2B, switch $P_{(i)}$ opens. As switch $N_{(i)}$ is still open, channel charge of the switch-Q will be stored on the capacitor. This will lead to voltage transitions on the drain and the bias nodes.

In FIG. 2C, the switch $P_{(i)}$ is still open and switch $N_{(i)}$ closes. The charge-Q deposited on the capacitor will be transmitted to the channel of the switch $N_{(i)}$, and the voltage bias will return to normal.

When DAC cells are coupled together in a larger circuit, as illustrated in FIG. 3A~FIG. 3C, transitions on the bias node will be visible at the DAC output. Transitions on the bias node mean the output spectrum of the DAC will contain harmonics, which will present as distortion in the output signal. When the DAC is used in an audio circuit, this harmonic distortion will cause problems in the output signal. Second-order or 'even' harmonics are even-numbered multiples of the fundamental frequencies and create a rich, pleasing sound. Third-order or 'odd' harmonics are oddnumbered multiples of the fundamental frequencies, which give the signal an edgier, more aggressive sound.

In FIG. 3A, the DAC is at a steady state with all P switches closed and all N switches open. In FIG. 3B, the first three P switches are closed and the final P switch is open; similarly, the first three N switches are open and the final N switch is closed. To go from the state shown in FIG. 3A to the state shown in FIG. 3B therefore involves one transition, which will be seen on the bias node and at the output of the DAC.

In FIG. 3C, the first two P switches are closed and the last two P switches are open; similarly, the first two N switches are open and the last two N switches are closed. To go from the state shown in FIG. 3A to the state shown in FIG. 3C therefore involves two transitions, which will be seen on the bias node and at the output of the DAC.

The common mode error is represented by the following equation: Common mode error=$2 \times |D[n]-D[n-1]|g_m \Delta V_e$.

The differential error is represented by the following equation:

$$\text{Differential error} = D[n] \times |D[n] - D[n - 1]|g_m \Delta V_e.$$

In the above, the term D[n] represents the fundamental harmonics of the signal. The term D[n]−D[n−1] is proportional to the input signal; therefore, if the input is reduced then this term will also be reduced. This term is a linear operation but its absolute value |D[n]−D[n−1] | will have even harmonics, such that when it is multiplied with the fundamental harmonic in D[n], odd order harmonics will be seen at the output of the DAC.

A common implementation of a DAC is a 17-level DAC consisting of eight tri-state DAC cells, as illustrated in FIG. 4, wherein each tri-state cell within the DAC operates in three operational states according to an input of +1, −1, or 0. During transitions, the gate-to-drain capacitor coupling of the tail transistors will cause even-order harmonics to be present on the bias nodes, which will mix with the fundamental harmonics at the input to the tri-state DAC, producing odd-order (third-order) harmonics at the output of the tri-state DAC. The even-order harmonics are proportional to the input amplitude. When the input amplitude is raised by a certain amount, the second-order harmonics will increase proportionally, thereby also increasing the third-order harmonics, which will limit the peak SDNR of the tri-state DAC.

SUMMARY

It is therefore an objective of the present invention to provide a DAC cell which can reduce odd-order harmonics at the output. This is achieved by providing a dead band switch coupled to at least one transistor within a DAC cell, wherein the dead band switch is controlled by a periodic signal.

A DAC cell circuit according to an exemplary embodiment comprises: at least a DAC cell, comprising: a first MOSFET having a drain coupled to a first switch for receiving a first current and coupled to a second switch for generating a second current, a source coupled to ground, and a gate coupled to a first bias voltage; a capacitor coupled between the gate and the drain of the first MOSFET; and a dead-band switch coupled between the gate of the first MOSFET and the bias node. The dead-band switch is open during a data transition.

The DAC cell circuit further comprises: a plurality of DAC cells coupled in parallel; a voltage generating circuit coupled to the first current and the second current for generating a differential output voltage; and a reference voltage coupled to the source of the first MOSFET of each DAC cell. The dead-band switches are controlled by a signal which is periodic with respect to a frequency which is equal to an input data rate of the plurality of DAC cells.

In one exemplary embodiment, the DAC cell circuit further comprises: a common mode voltage; and a plurality of switches coupled between the common mode voltage and the drain of the first MOSFET of each DAC cell.

In a modification, each DAC cell comprises a second MOSFET coupled in cascode above the first MOSFET, and the DAC cell circuit further comprises a cascode voltage coupled to the gate of the second cascode MOSFET of each DAC cell.

In another modification, each DAC cell comprises a second MOSFET coupled in cascode below the first MOS-FET, and the DAC cell circuit further comprises a second bias voltage coupled to a gate of the second cascode MOS-FET of each DAC cell. Each DAC cell further comprises a second dead-band switch coupled between the second bias voltage and the gate of the second MOSFET.

In yet another modification, each DAC cell comprises a resistor coupled between the source of the first MOSFET and the reference voltage.

These and other objectives of the present invention will no doubt become obvious to those of ordinary skill in the art after reading the following detailed description of the pre-ferred embodiment that is illustrated in the various figures and drawings.

DETAILED DESCRIPTION

Figure 1:
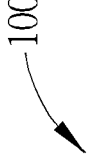
FIG. 1 is a diagram of a DAC cell according to the related art.
Figure 1:
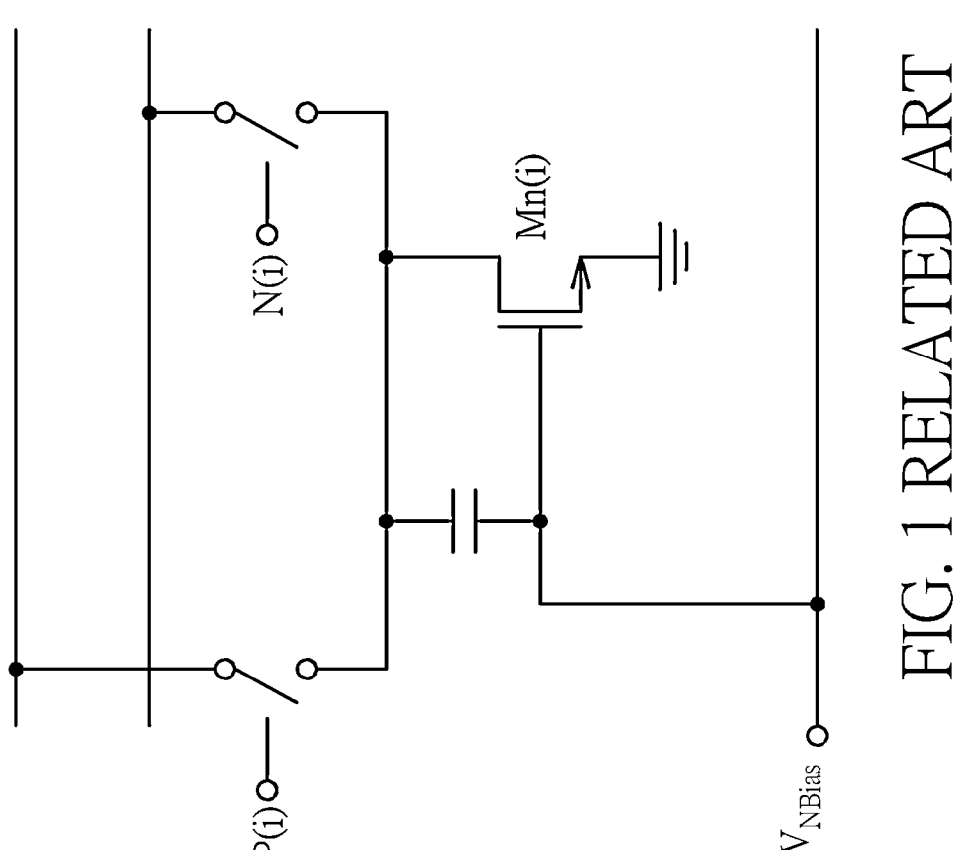
Figure 2A:
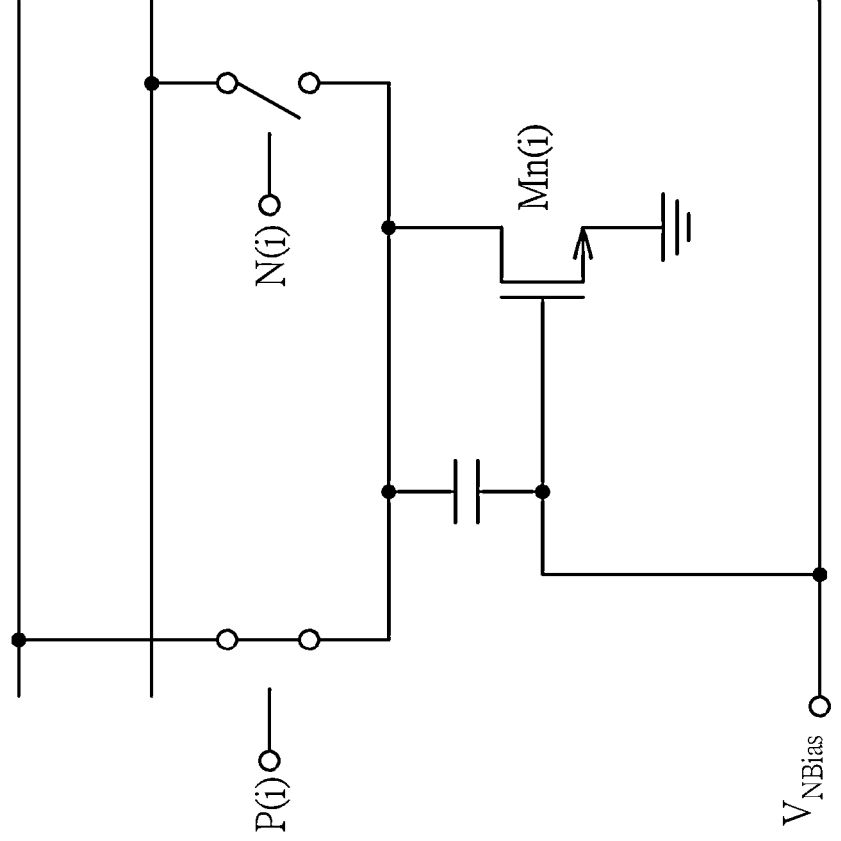
FIG. 2A is a diagram of a DAC cell undergoing a data transition according to the related art.
Figure 2B:
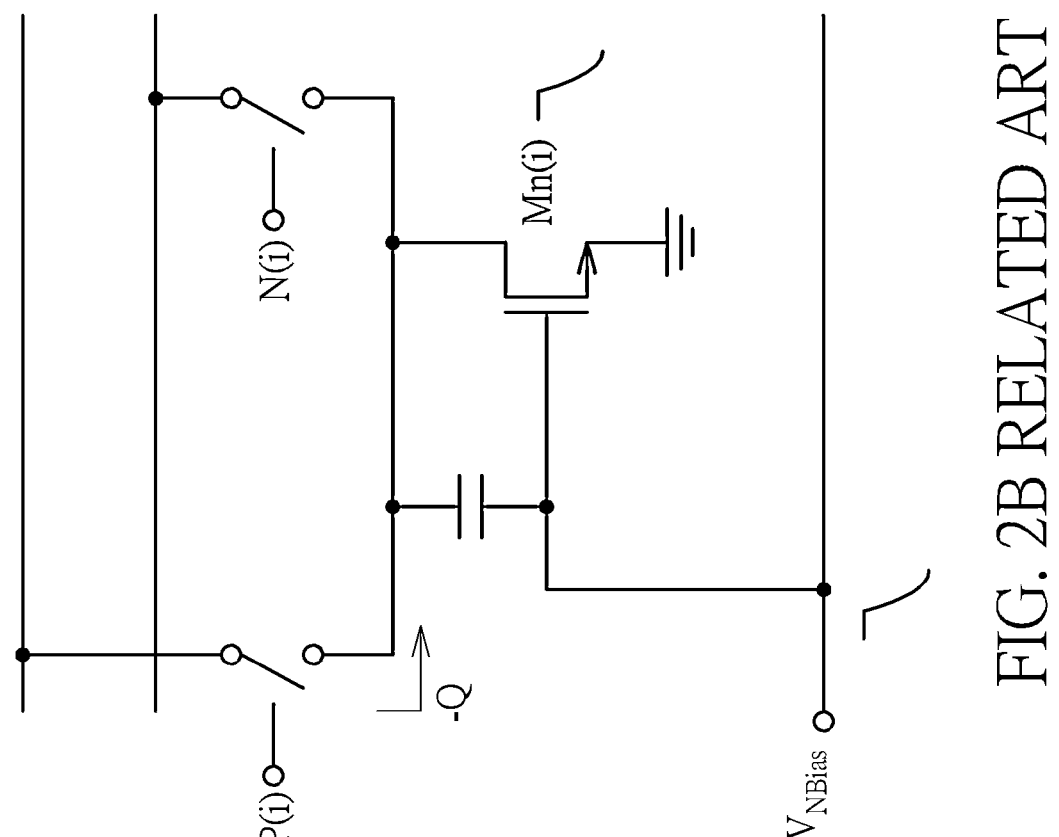
FIG. 2B is a diagram of a DAC cell undergoing a data transition according to the related art.
Figure 2C:
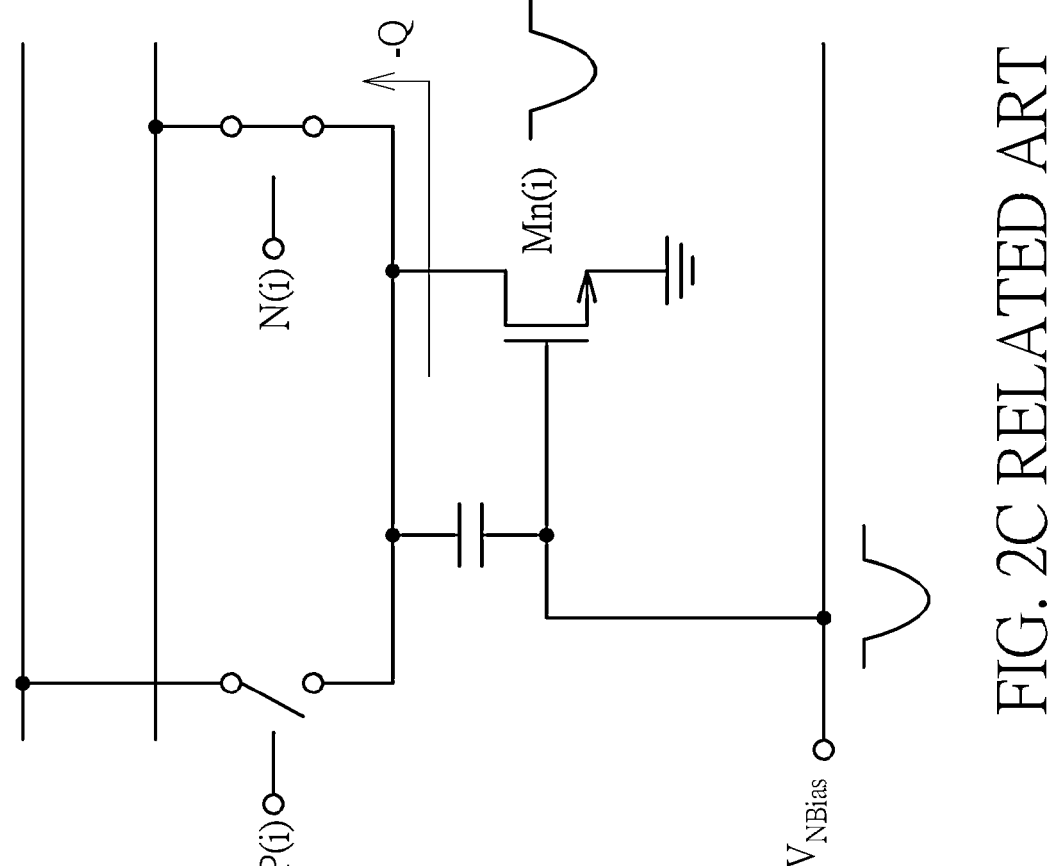
FIG. 2C is a diagram of a DAC cell undergoing a data transition according to the related art.
Figure 3A:
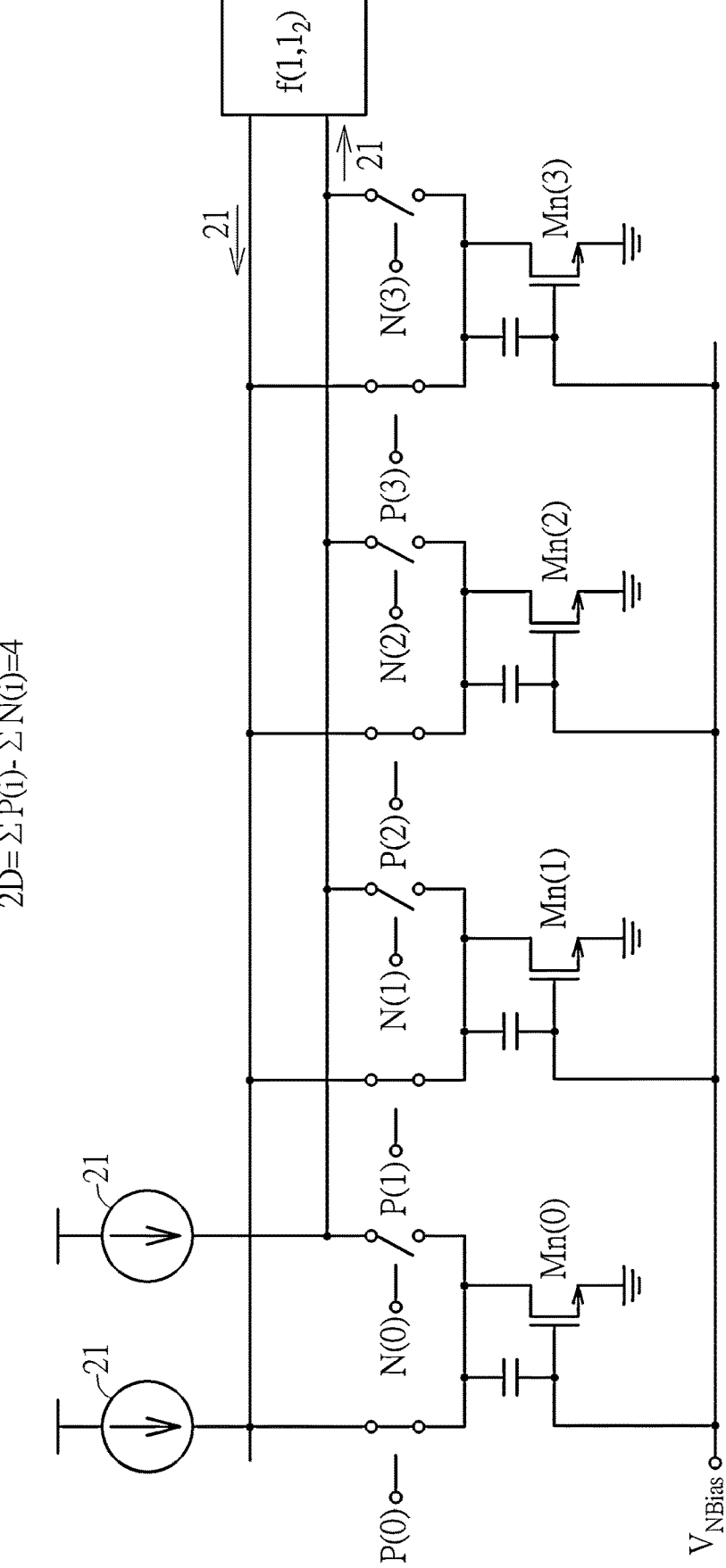
FIG. 3A is a diagram of a DAC cell circuit according to the related art.
Figure 3B:
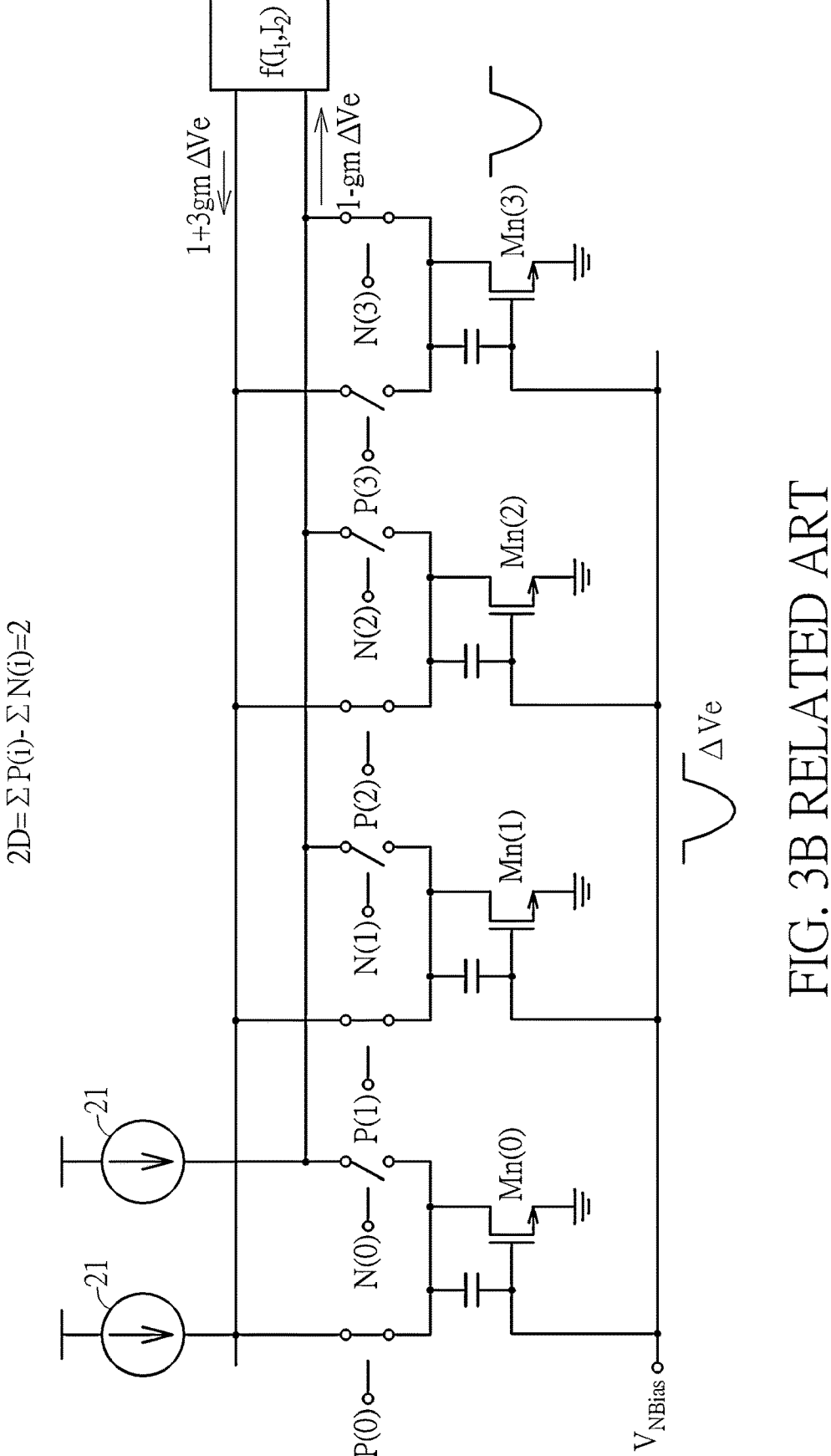
FIG. 3B is a diagram of a DAC cell circuit according to the related art.
Figure 3C:
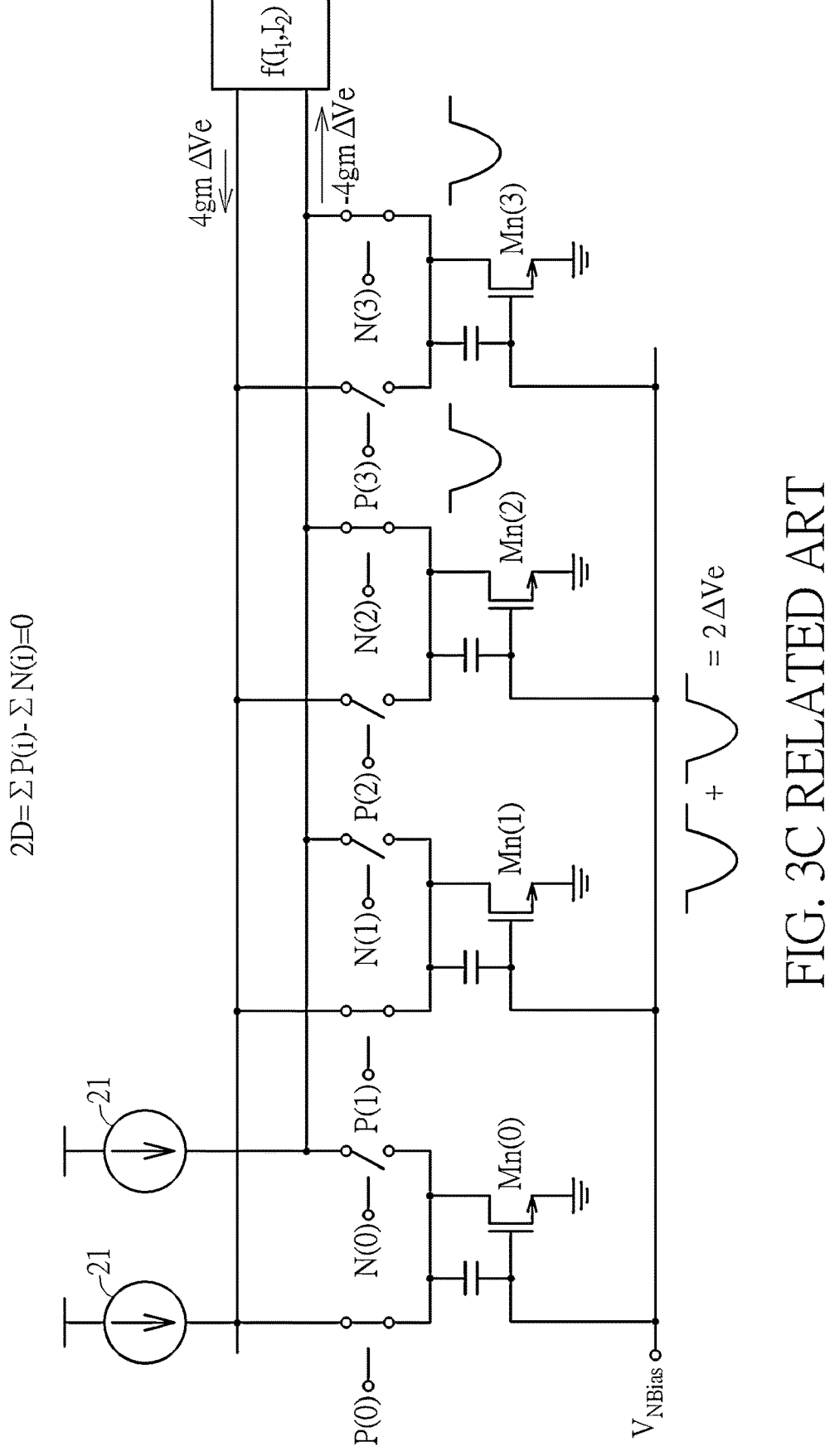
FIG. 3C is a diagram of a DAC cell circuit according to the related art.
Figure 4:
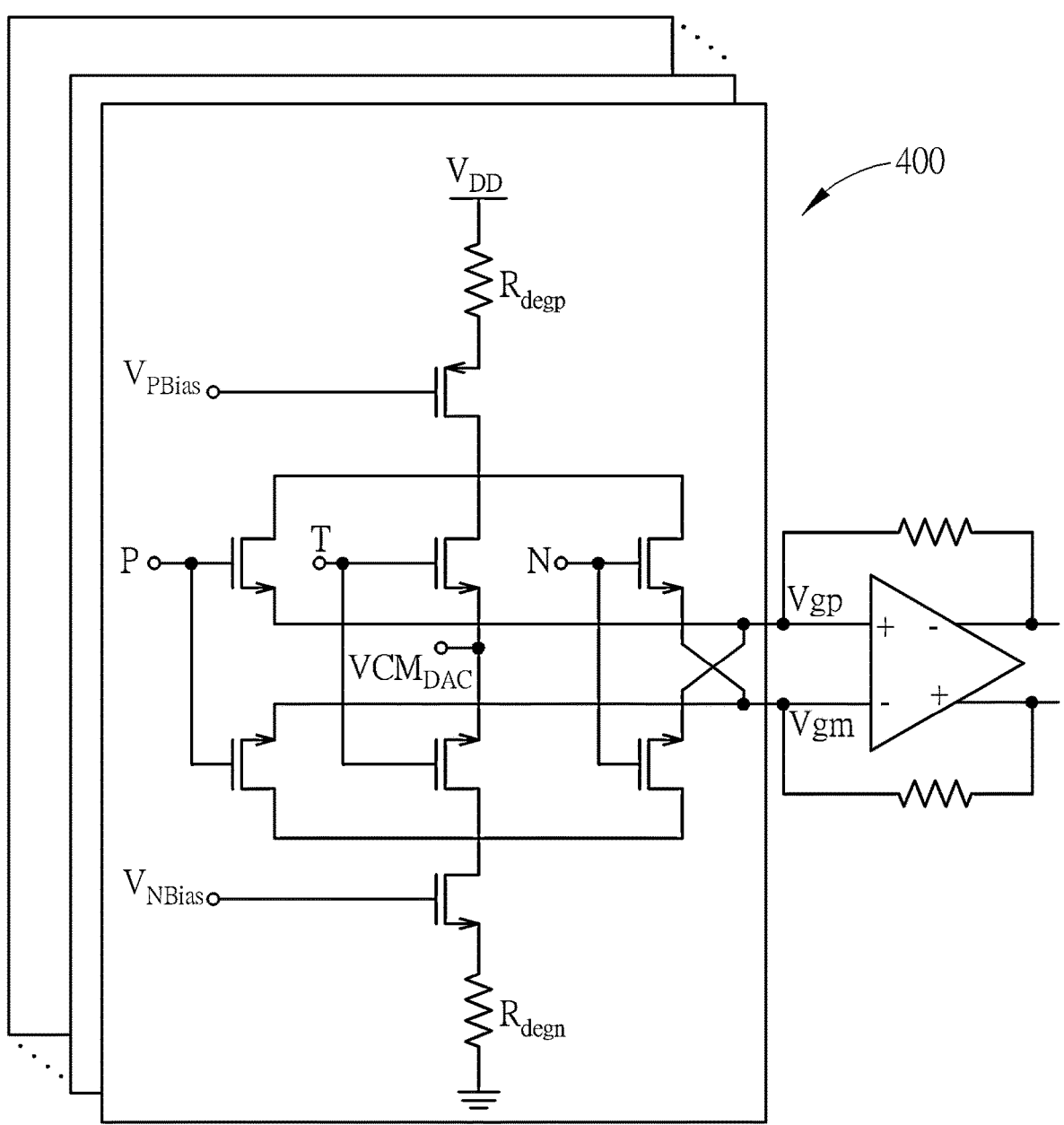
FIG. 4 is a diagram of a tri-state DAC cell circuit according to the related art.
Figure 5:
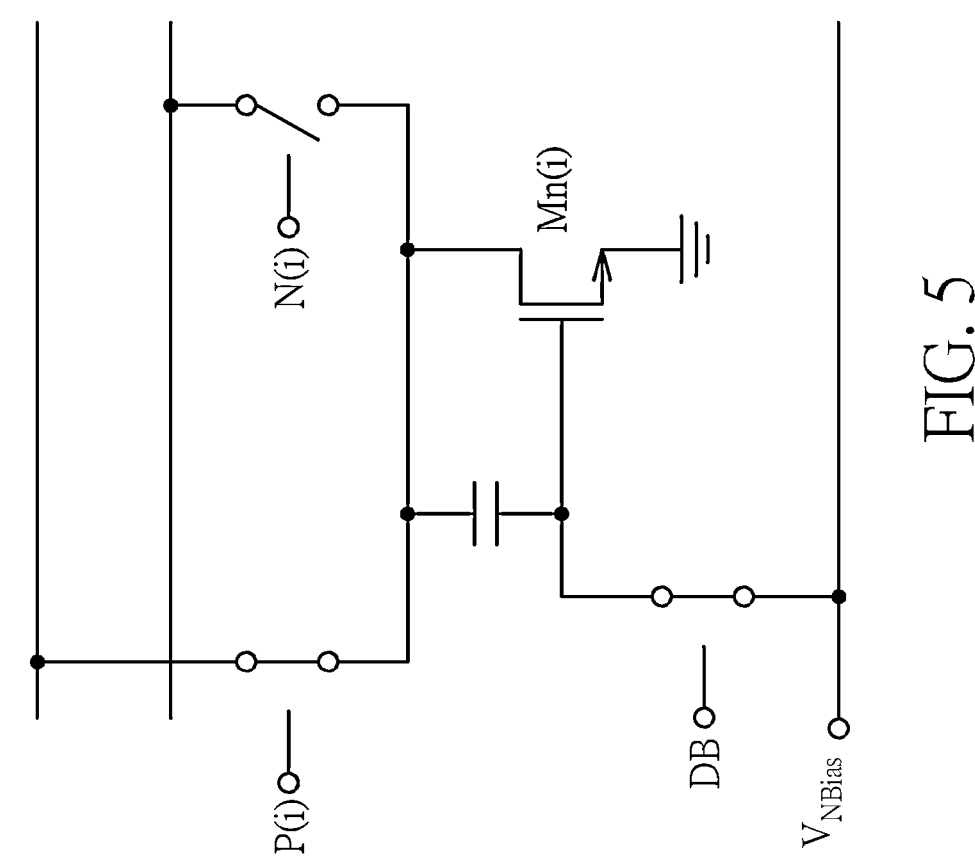
FIG. 5 is a diagram of a DAC cell according to an embodiment of the present invention.

Refer to FIG. 5, which is a schematic diagram of a DAC cell 500 according to an exemplary embodiment of the present invention. As in the DAC cell 100 illustrated in FIG. 1, the DAC cell 500 comprises a first switch $P_{(i)}$, a second switch $N_{(i)}$, a capacitor, and a transistor/MOSFET $Mn_{(i)}$, wherein the capacitor and MOSFET are coupled to a bias line at a common bias node which receives a bias voltage $V_{NBias}$. Different from the DAC cell 100, however, the DAC cell 500 further comprises a dead band switch (DB) which is coupled between the common bias node, the capacitor and the gate of the MOSFET. The dead band switch can be controlled by a periodic signal, and can work to isolate the MOSFET from the bias node during data transitions. This will be illustrated in the following.

Figure 6A:
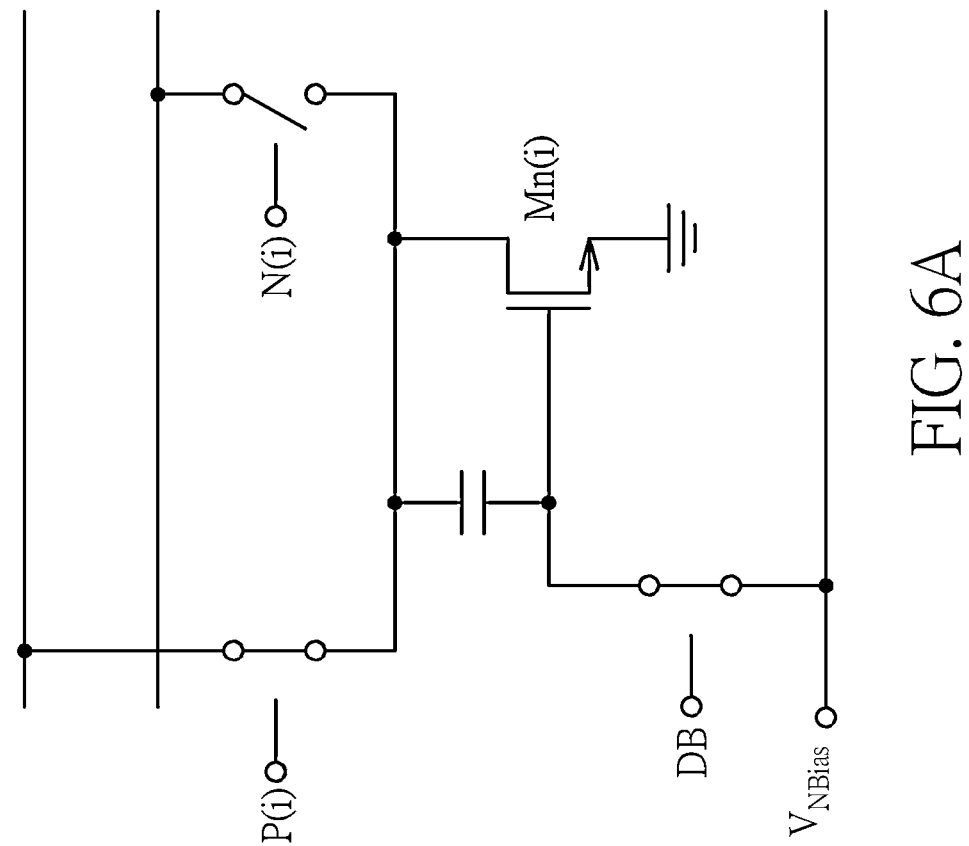
FIG. 6A is a diagram of a DAC cell undergoing a data transition according to an embodiment of the present invention.
Figure 6B:
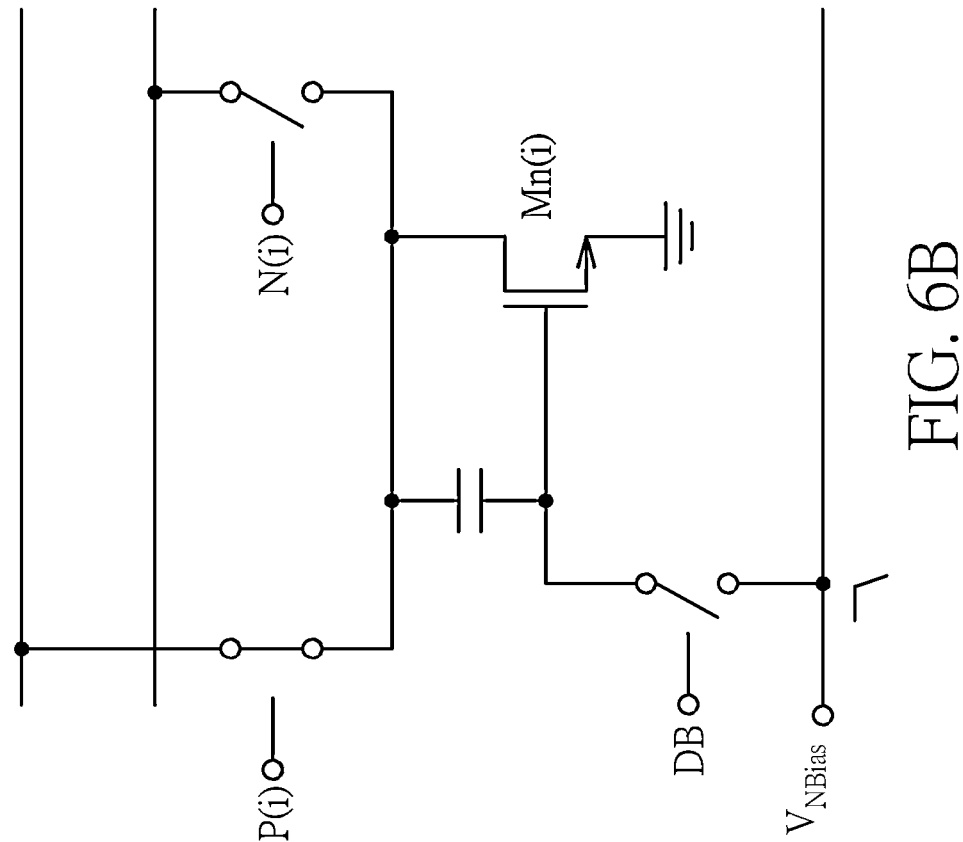
FIG. 6B is a diagram of a DAC cell undergoing a data transition according to an embodiment of the present invention.
Figure 6C:
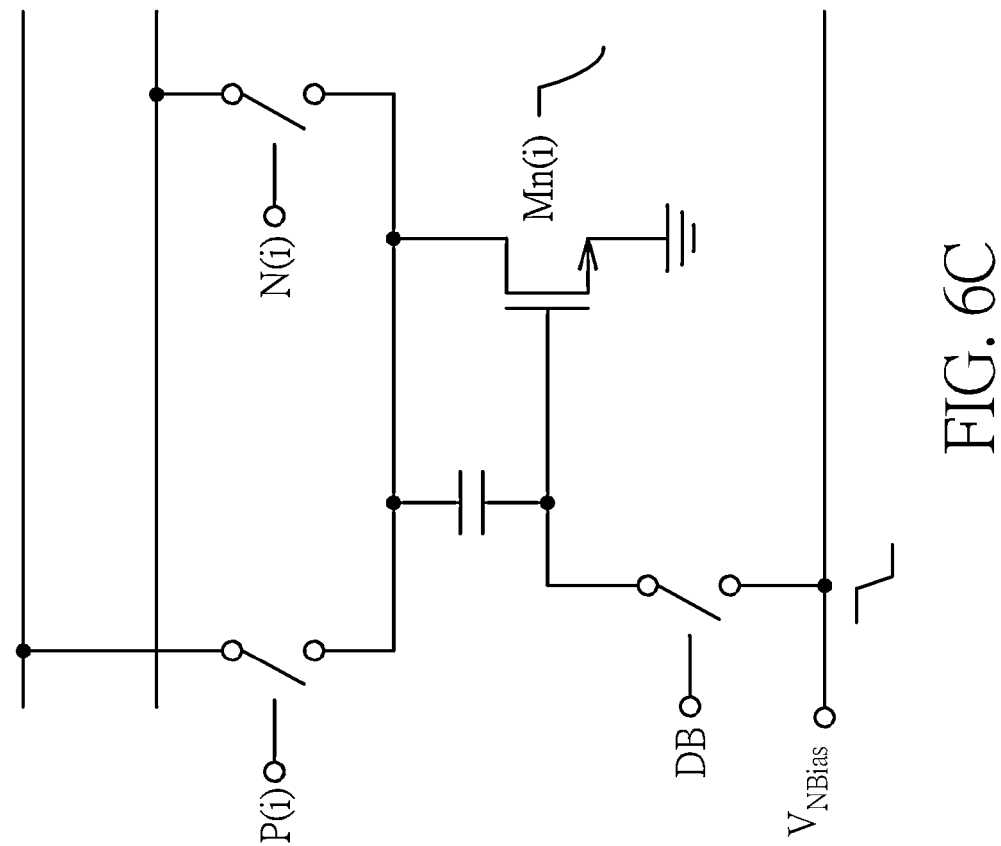
FIG. 6C is a diagram of a DAC cell undergoing a data transition according to another embodiment of the present invention.

Refer to FIG. 6A~6E, which illustrate the DAC cell 500 undergoing a data transition from +1 to −1, wherein switch $P_{(i)}$ goes from state 1 to 0 (i.e. closed to open), and switch $N_{(i)}$ goes from state 0 to 1 (i.e. open to closed). As shown in FIG. 6A, switch $P_{(i)}$ is closed, switch $N_{(i)}$ is open, and the DB switch is closed. In FIG. 6B, the DB switch is open before any data transition to isolate any transitions occurring on the bias node. The effect of the DB switch opening will appear as a slight transition on the bias node. In FIG. 6C, switch $P_{(i)}$ will open, while switch $N_{(i)}$ and the DB switch also remain open. The transition because of the charge transfer to the capacitor will appear at the output of the MOSFET but this transition will not appear on the bias node.

Figure 6D:
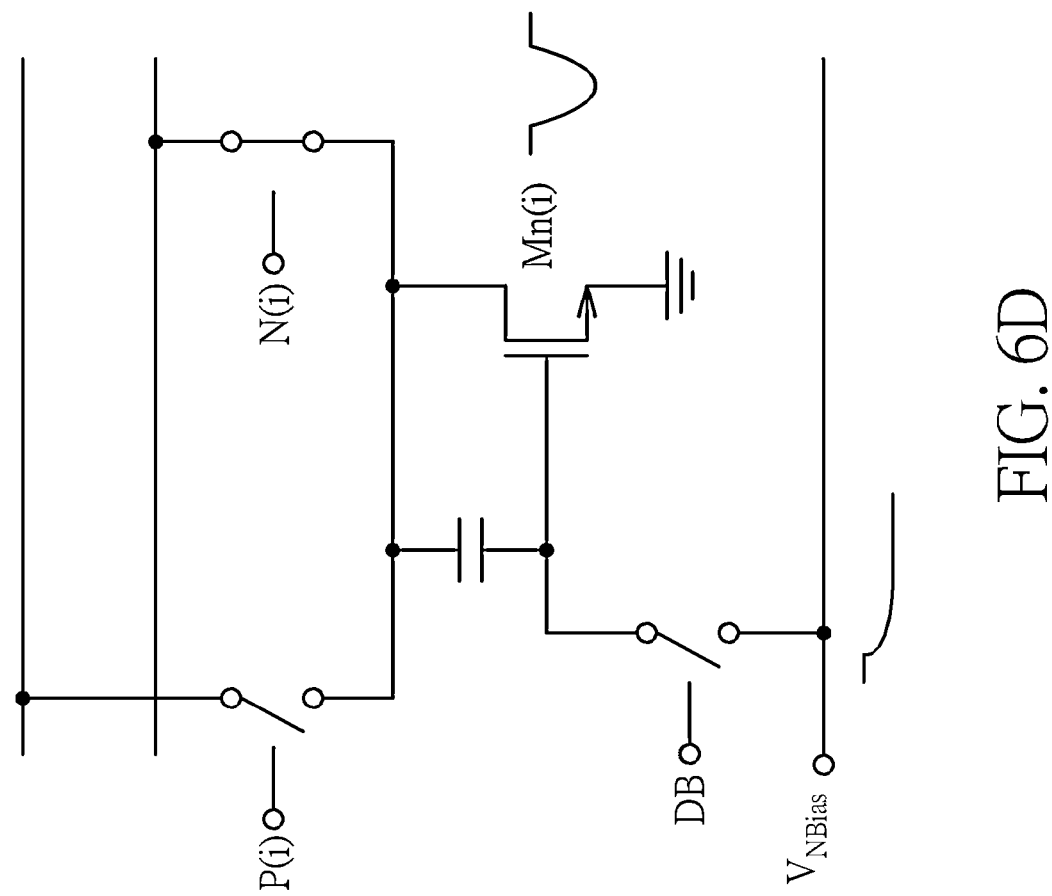
FIG. 6D is a diagram of a DAC cell undergoing a data transition according to another embodiment of the present invention.
Figure 6E:
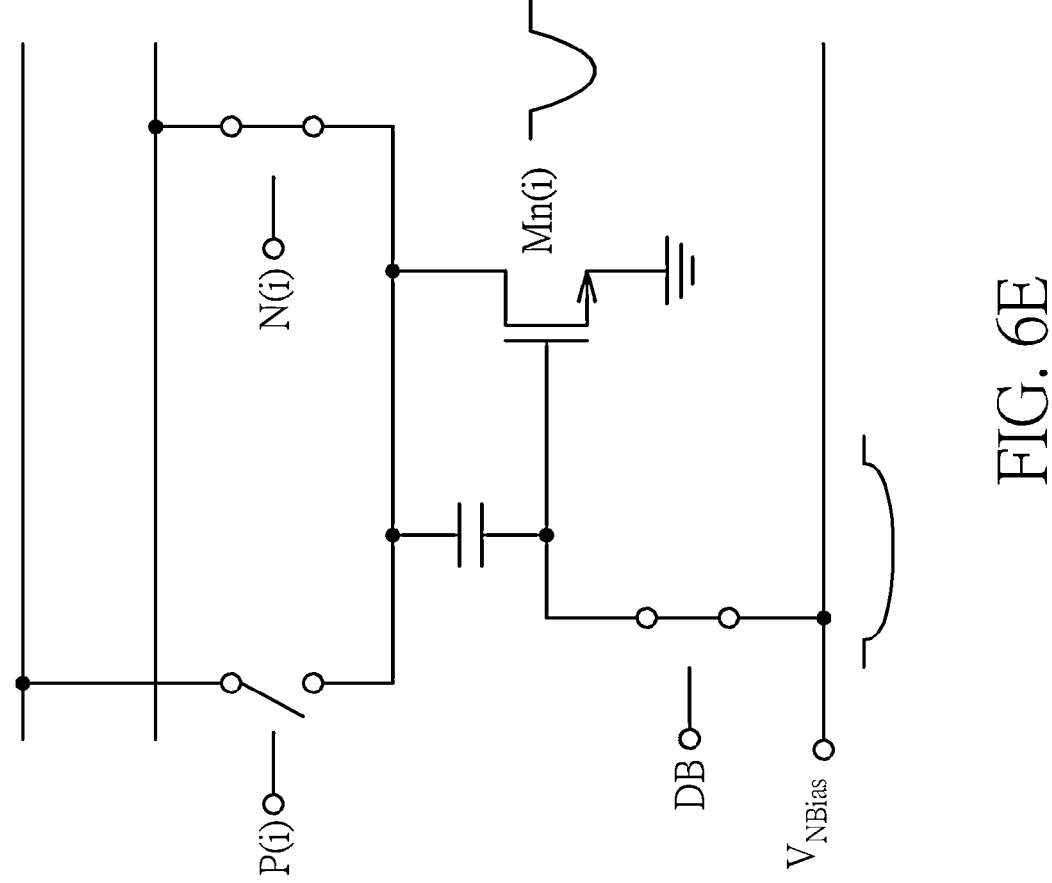
FIG. 6E is a diagram of a DAC cell undergoing a data transition according to another embodiment of the present invention.

In FIG. 6D, switch $P_{(i)}$ and the DB switch remain open. Switch $N_{(i)}$ is closed so that the capacitor will be discharged. At this point, the transition on the output node will go back to the original level. In FIG. 6E, the DB switch will close again. At this point, only a small transition will occur on the bias node, such that the amplitude of any odd-order har-monics at the output of the DAC cell 500 will be minimized. The time between closing the switch $N_{(i)}$ and closing the DB switch will depend on the size of the capacitor.

Figure 7:
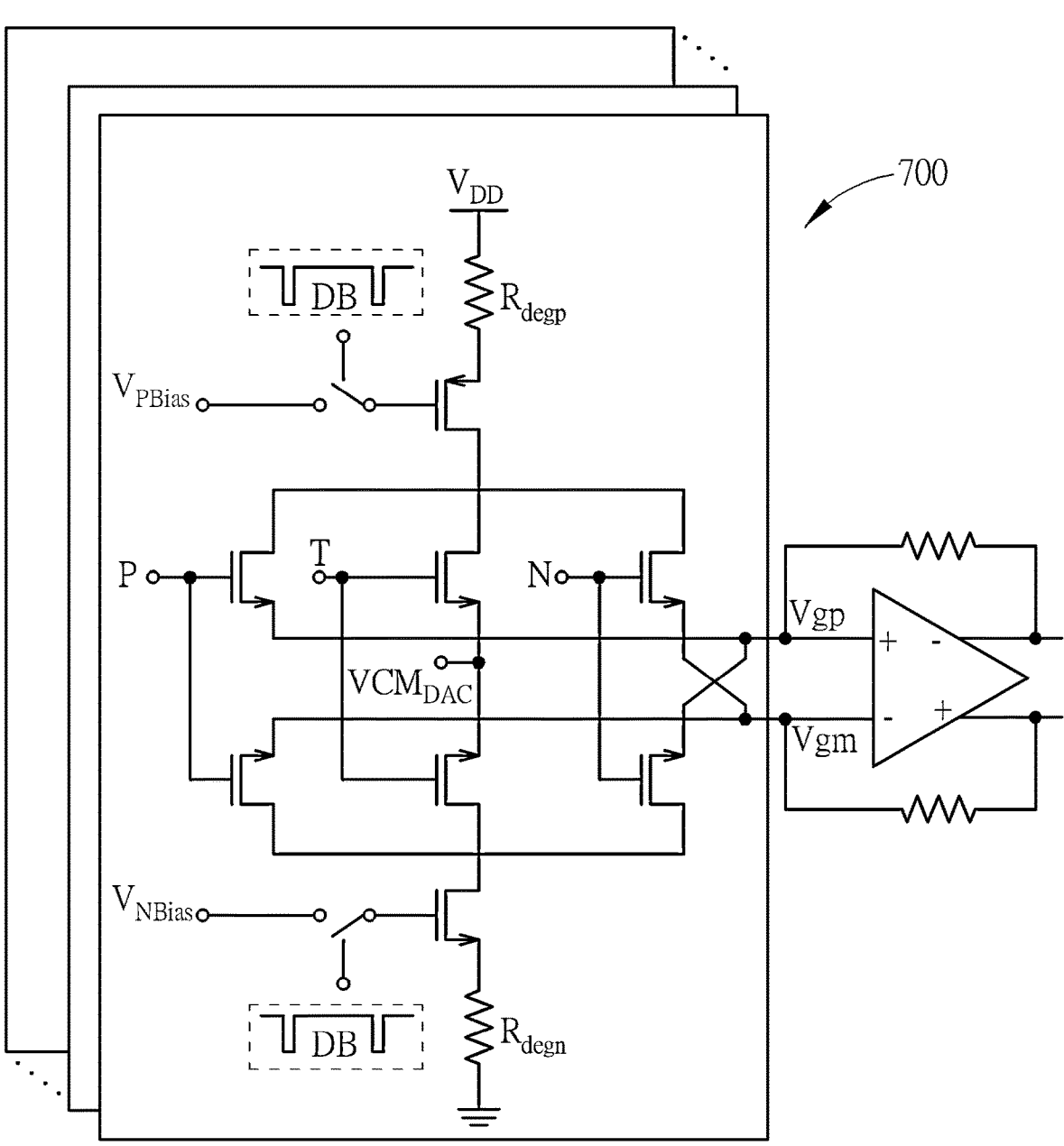
FIG. 7 is a diagram of a tri-state DAC cell according to an embodiment of the present invention.

FIG. 7 illustrates a 17-level tri-state DAC applying the dead band switch architecture illustrated in FIG. 5. As shown in the diagram, there is a DB switch on the bias node in each of the DAC cells, and the DB switches are operated according to a periodic signal which has a frequency equal to the input data rate, wherein the DB switch is always open during a data transition. The isolation of the bias node via the DB switch means that the bias nodes exhibit reduced data-dependent transitions, meaning that there will be reduced even-order harmonics on the bias nodes. This means that the output of the DAC will exhibit reduced odd-order harmonics.

The proposed DAC cell structure incorporating a DB switch can be applied to a number of different circuit architectures, which will be detailed in the following.

Figure 8:
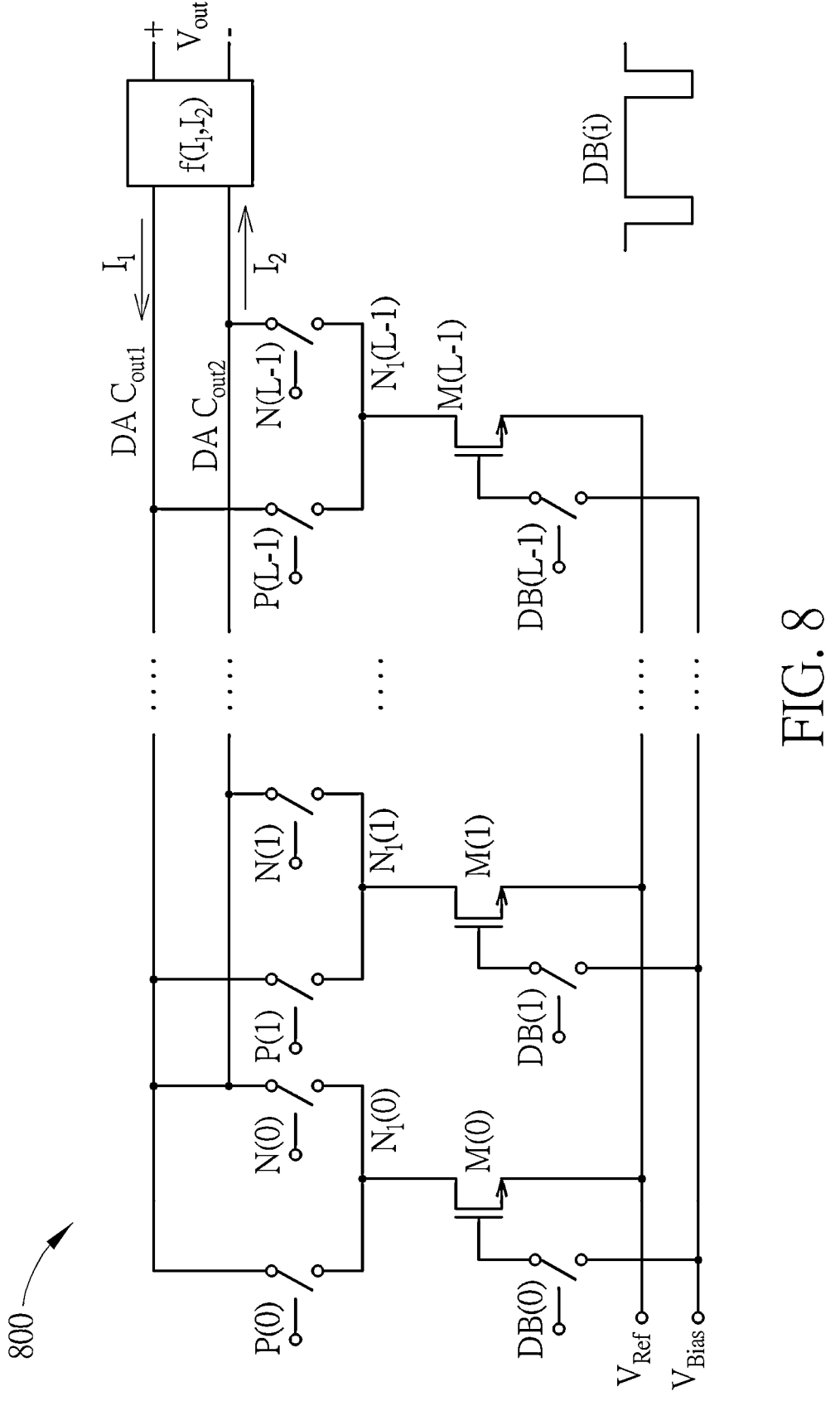
FIG. 8 is a diagram of a DAC cell circuit according to an exemplary embodiment of the present invention.

Refer to FIG. 8, which illustrates a plurality of DAC cells coupled in parallel, wherein each DAC cell comprises a DB switch coupled between the bias node and the gate of the MOSFET. Note that the capacitors in each DAC cell are not illustrated for simplicity, and that, as long as the DB switch structure controlled by a periodic signal is maintained, one skilled in the art may implement each DAC cell with a different architecture.

The differential output of the DAC cells is input to a processing circuit which receives the generated currents $I_1$ and $I_2$ and generates a differential $V_{out}$ signal. The DB switches are coupled to the bias node $V_{Bias}$ and the sources of the MOSFETs of each DAC cell are coupled to a reference voltage $V_{Ref}$.

Figure 9:
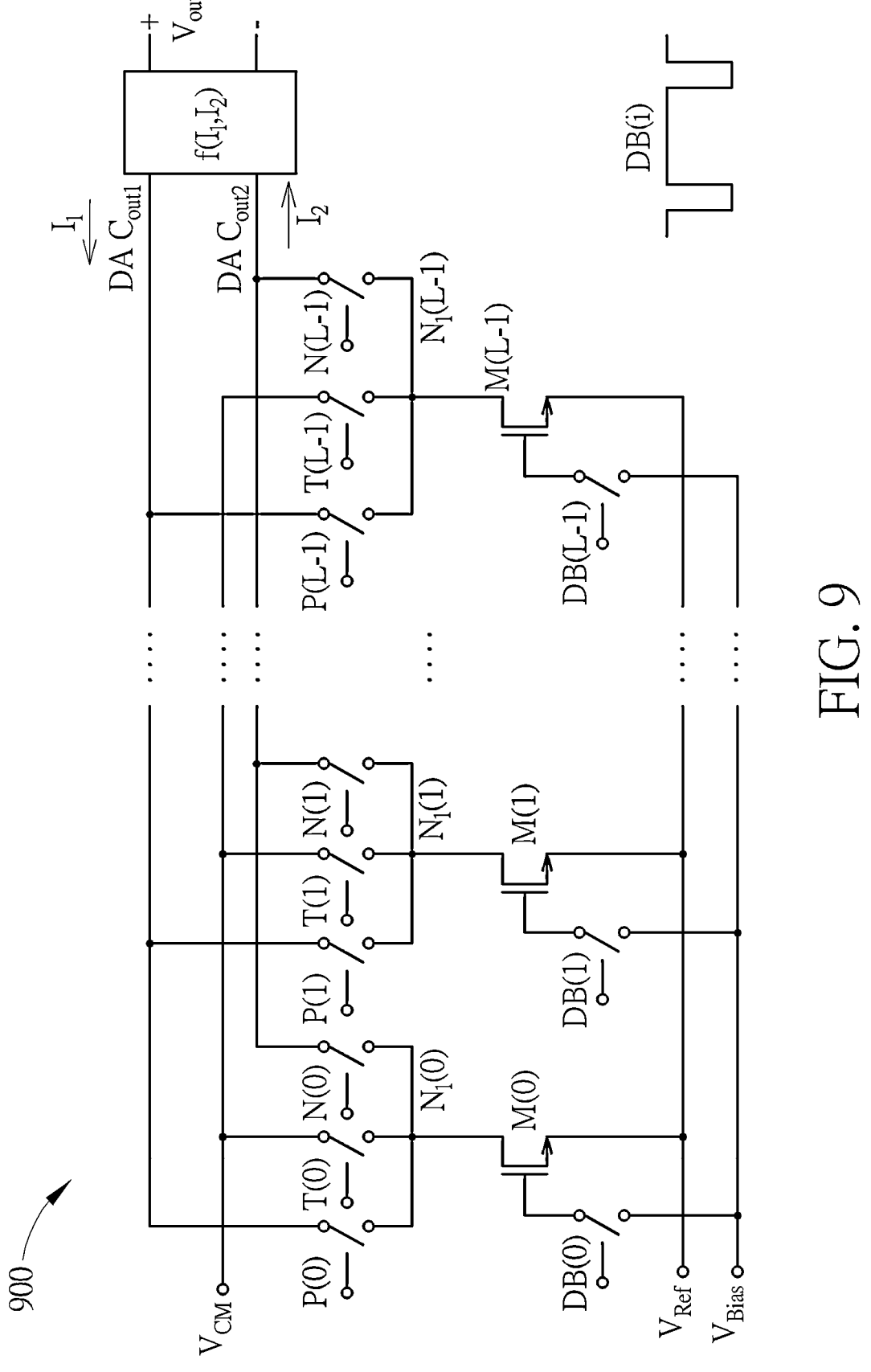
FIG. 9 is a diagram of a DAC cell circuit according to an exemplary embodiment of the present invention.

FIG. 9 illustrates a DAC circuit according to another embodiment. In this embodiment, each DAC cell further comprises a third switch $T_{(k)}$ coupled between the drain of the MOSFETs of each DAC cell and a common mode voltage $V_{CM}$, such that the DAC cell circuit in FIG. 9 is a tri-state circuit. The third switches are controlled by inputs $T_{(k)}$, for k=0, 1, . . . , L−1.

Figure 10:
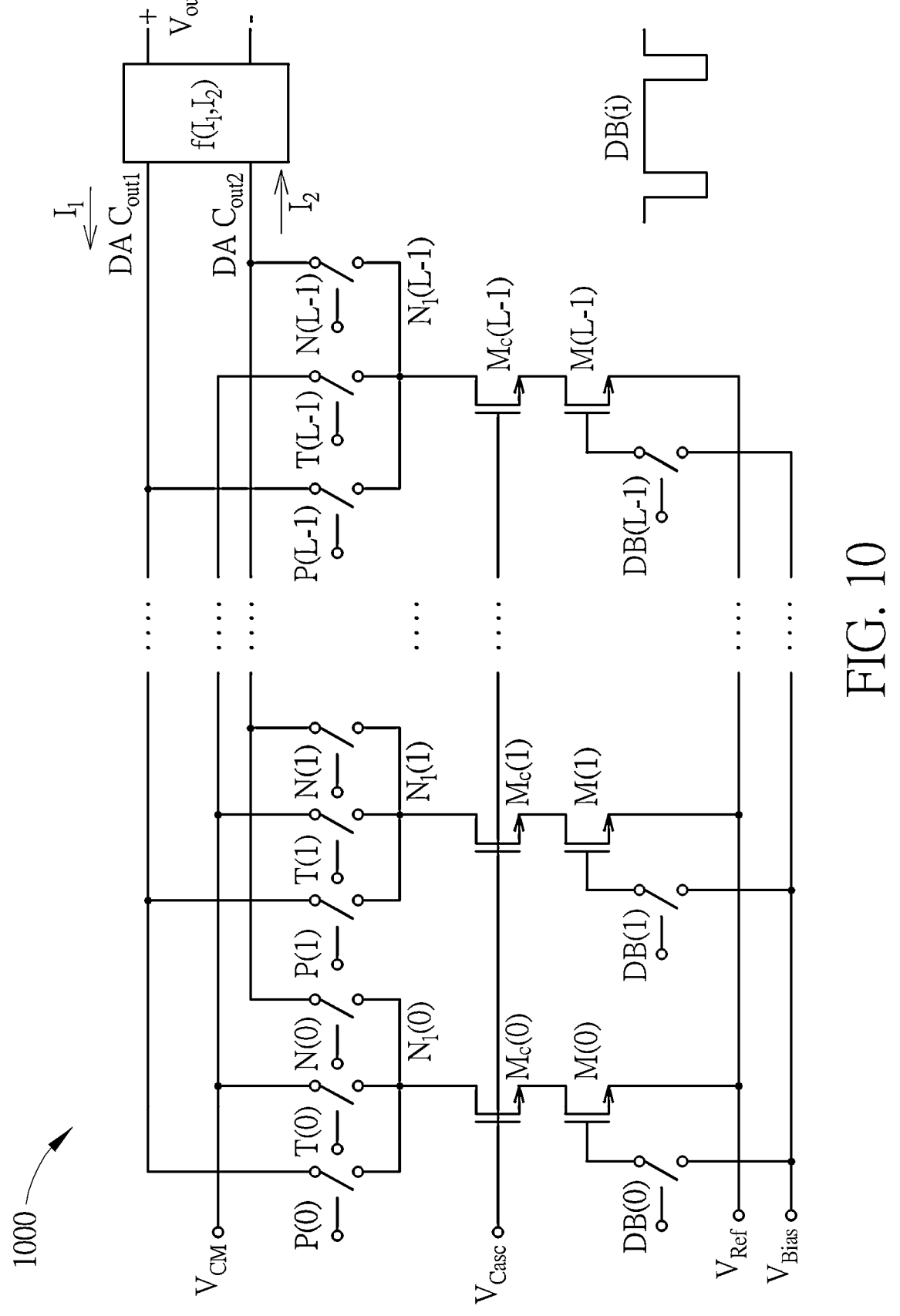
FIG. 10 is a diagram of a DAC cell circuit according to an exemplary embodiment of the present invention.

FIG. 10 illustrates a tri-state DAC circuit according to another embodiment. In this diagram, each DAC cell comprises two MOSFETs coupled in cascode, as well as a cascode voltage $V_{Casc}$ coupled to the gates of the first cascode MOSFET of each DAC cell. In this embodiment, the DB switches are respectively coupled between the gates of the second cascode MOSFETs of each DAC cell and the bias voltage.

Figure 11:
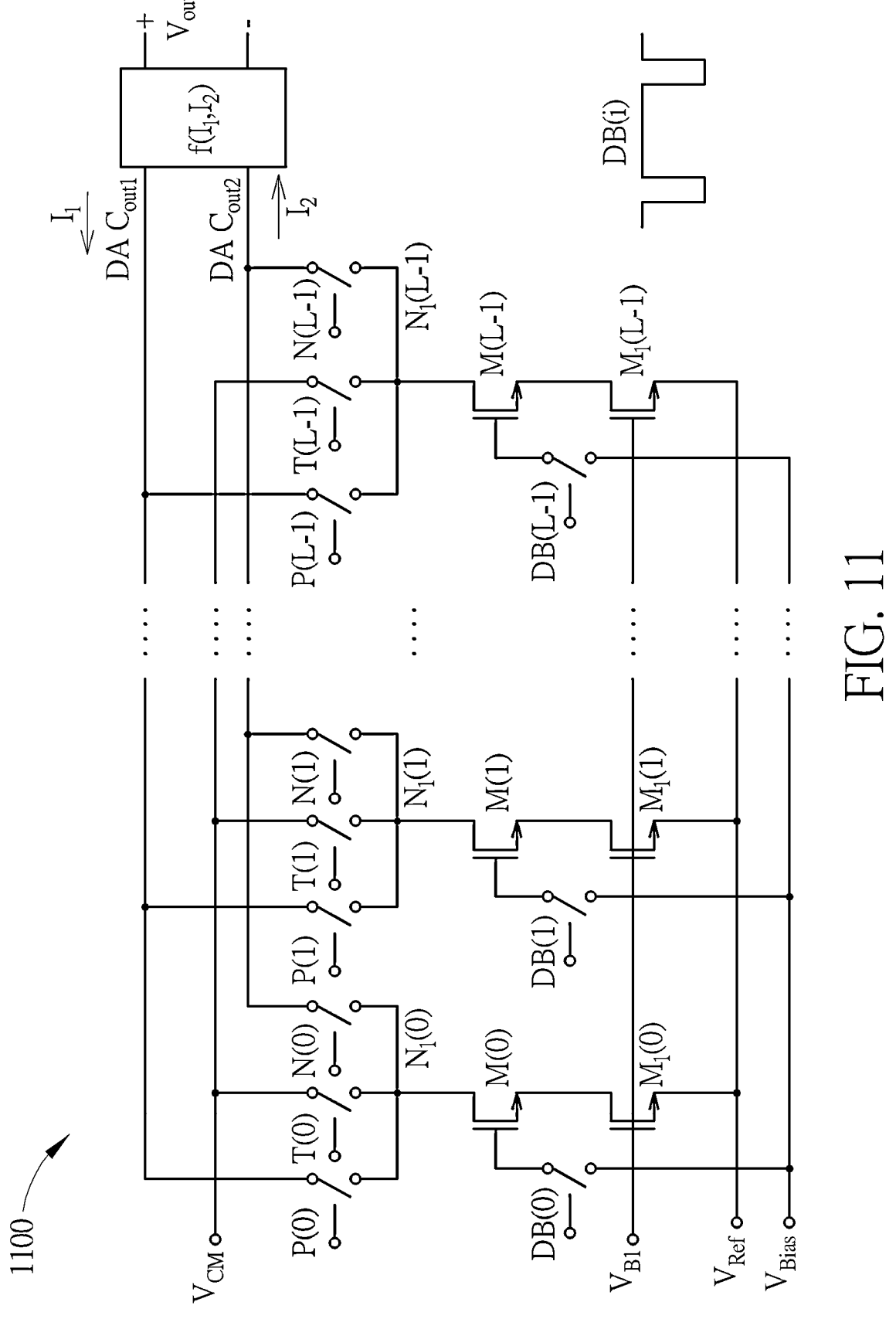
FIG. 11 is a diagram of a DAC cell circuit according to an exemplary embodiment of the present invention.

FIG. 11 also illustrates a DAC circuit comprising cascode MOSFETs according to another embodiment of the present invention. In this embodiment, the DB switches are coupled between the gates of the first cascode MOSFET of each DAC cell and the bias voltage, and the circuit comprises a second bias voltage $V_{B1}$ which is coupled to the gates of the second cascode MOSFET of each DAC cell. This embodiment isolates a different cascode transistor.

Figure 12:
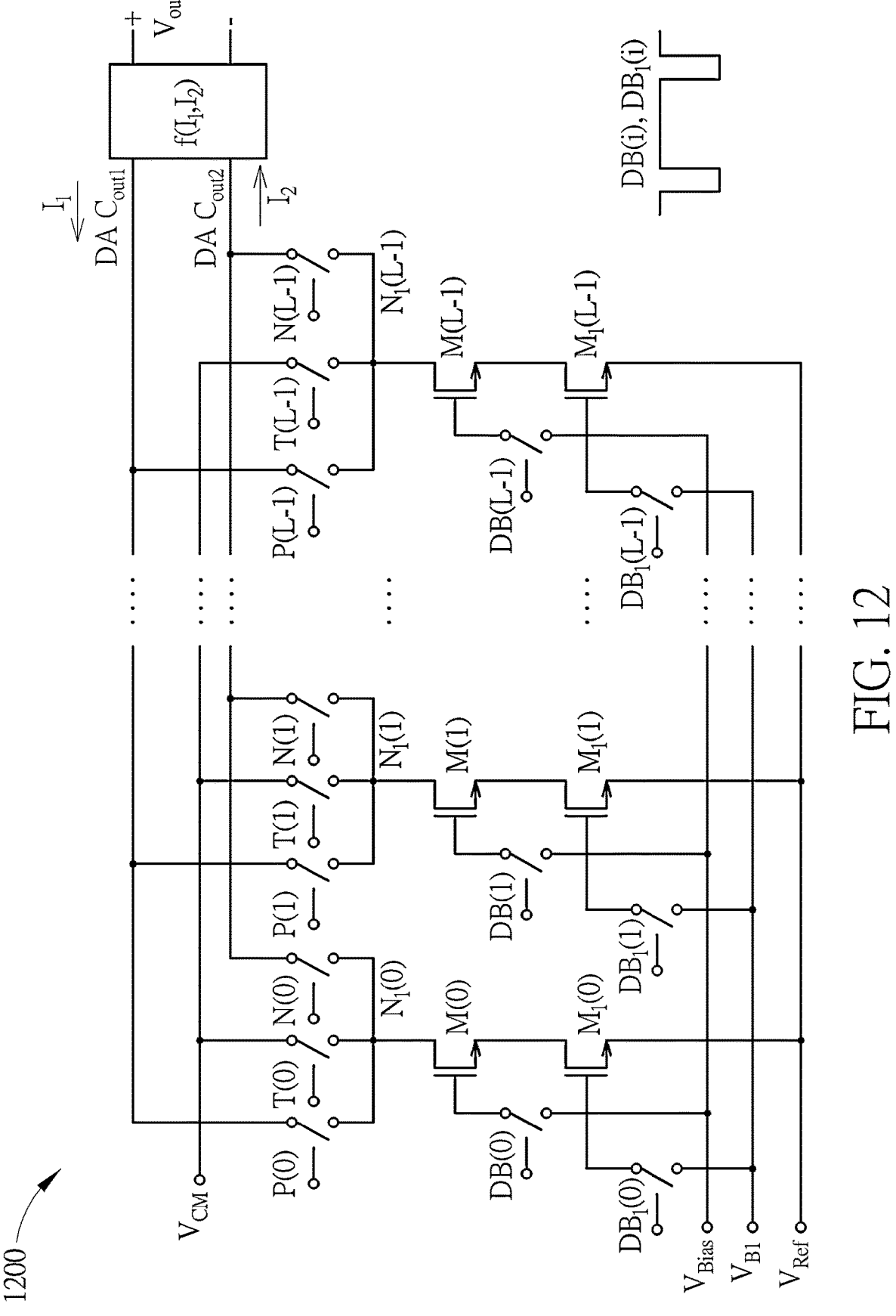
FIG. 12 is a diagram of a DAC cell circuit according to an exemplary embodiment of the present invention.

FIG. 12 illustrates another embodiment of a DAC circuit comprising cascode MOSFETs. In this embodiment, both cascode MOSFETs have a DB switch coupled to their respective gates, wherein the DB switches coupled to the second cascode MOSFETs are further coupled to a second bias voltage $V_{B1}$. The extra DB switch prevents transitions on the gates of both transistors.

Figure 13:
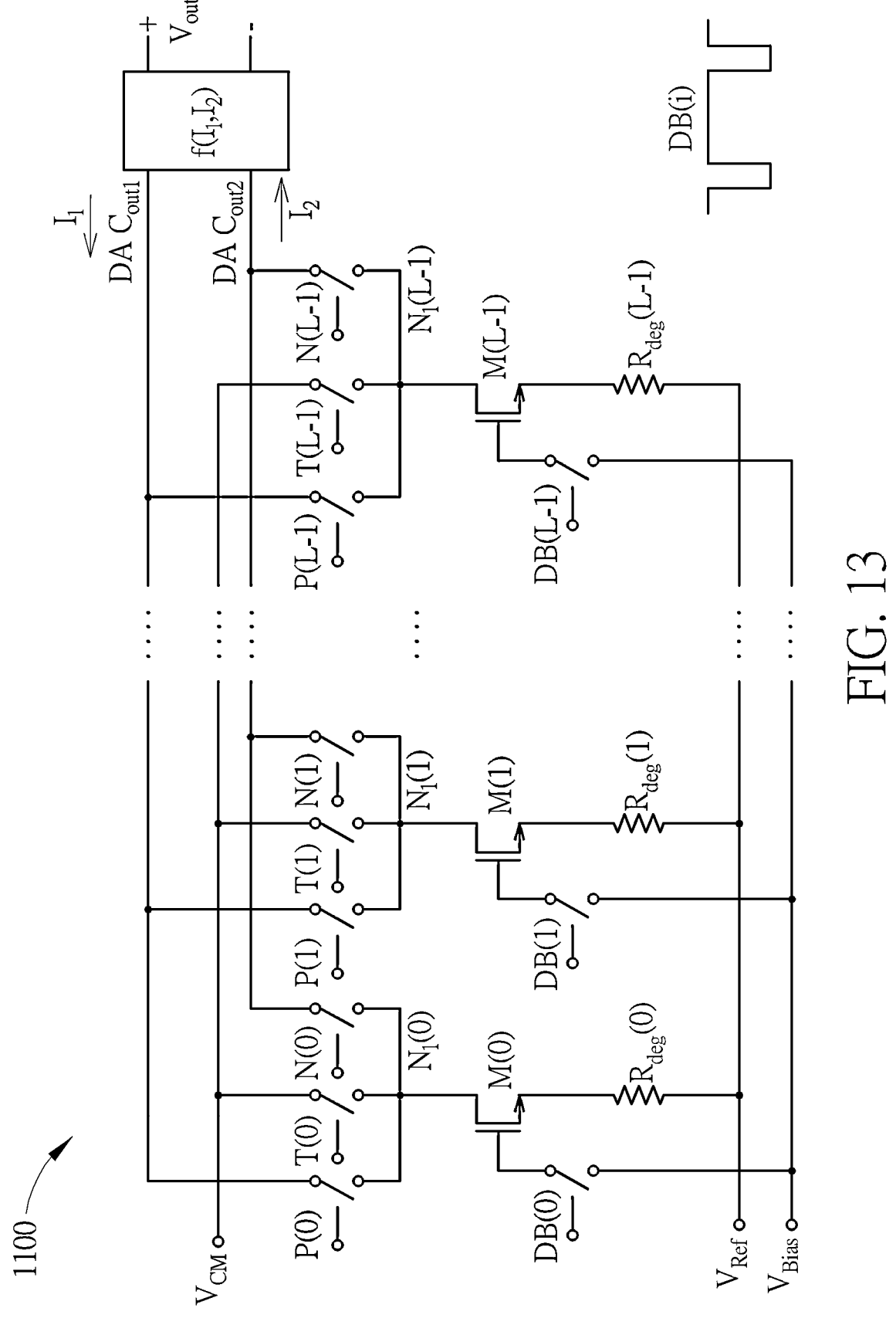
FIG. 13 is a diagram of a DAC cell circuit according to an exemplary embodiment of the present invention.

FIG. 13 illustrates a DAC circuit according to yet another embodiment of the present invention. This embodiment is a similar circuit to that illustrated in FIG. 9 but each DAC cell further comprises a resistor coupled between the source of each MOSFET and the reference voltage $V_{Ref}$.

Figure 14:
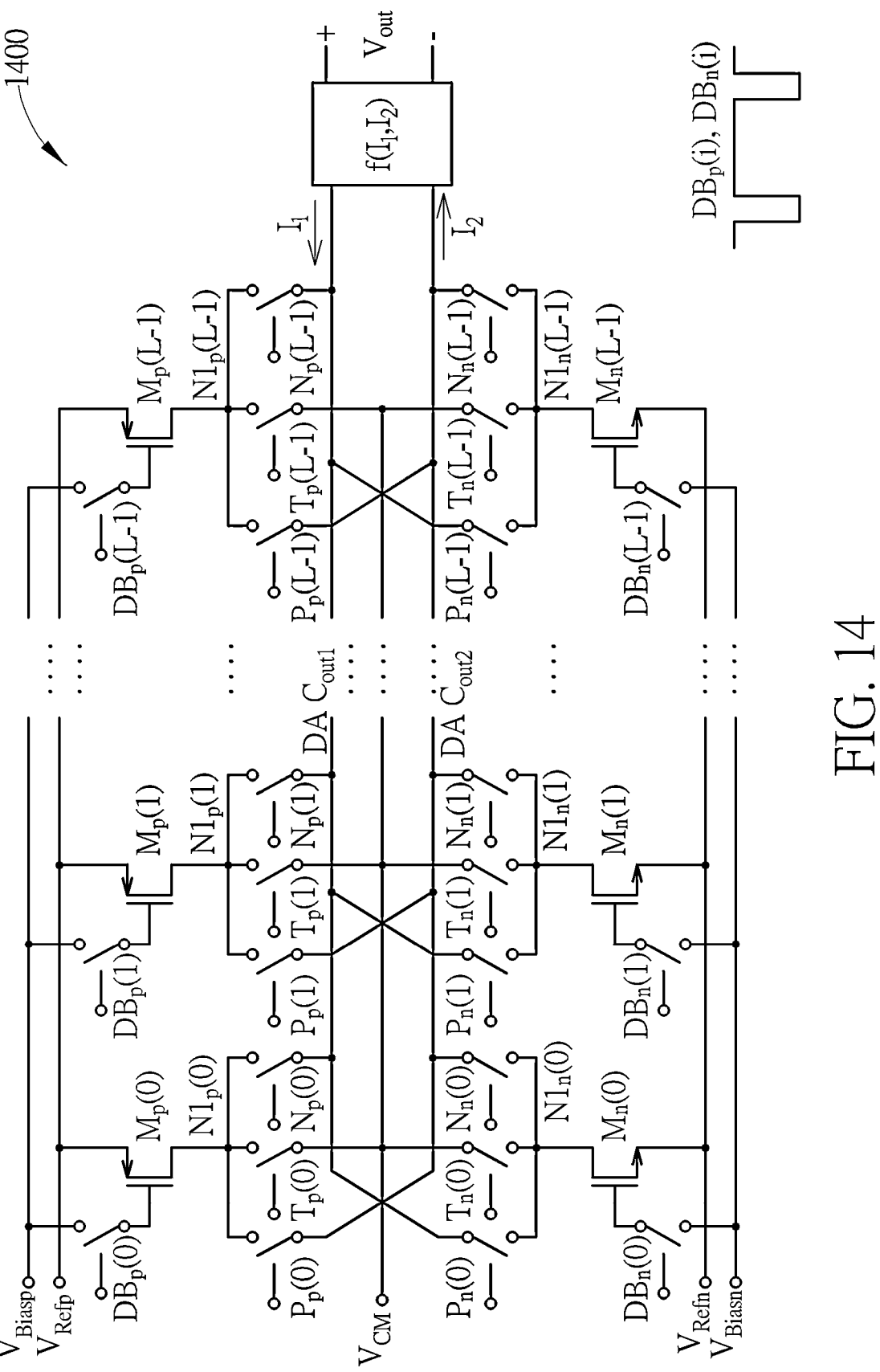
FIG. 14 is a diagram of a DAC cell circuit according to an exemplary embodiment of the present invention.

FIG. 14 illustrates a DAC circuit which is a complementary DAC circuit comprising a mirrored DAC circuit of the circuit illustrated in FIG. 9.

Figure 15:
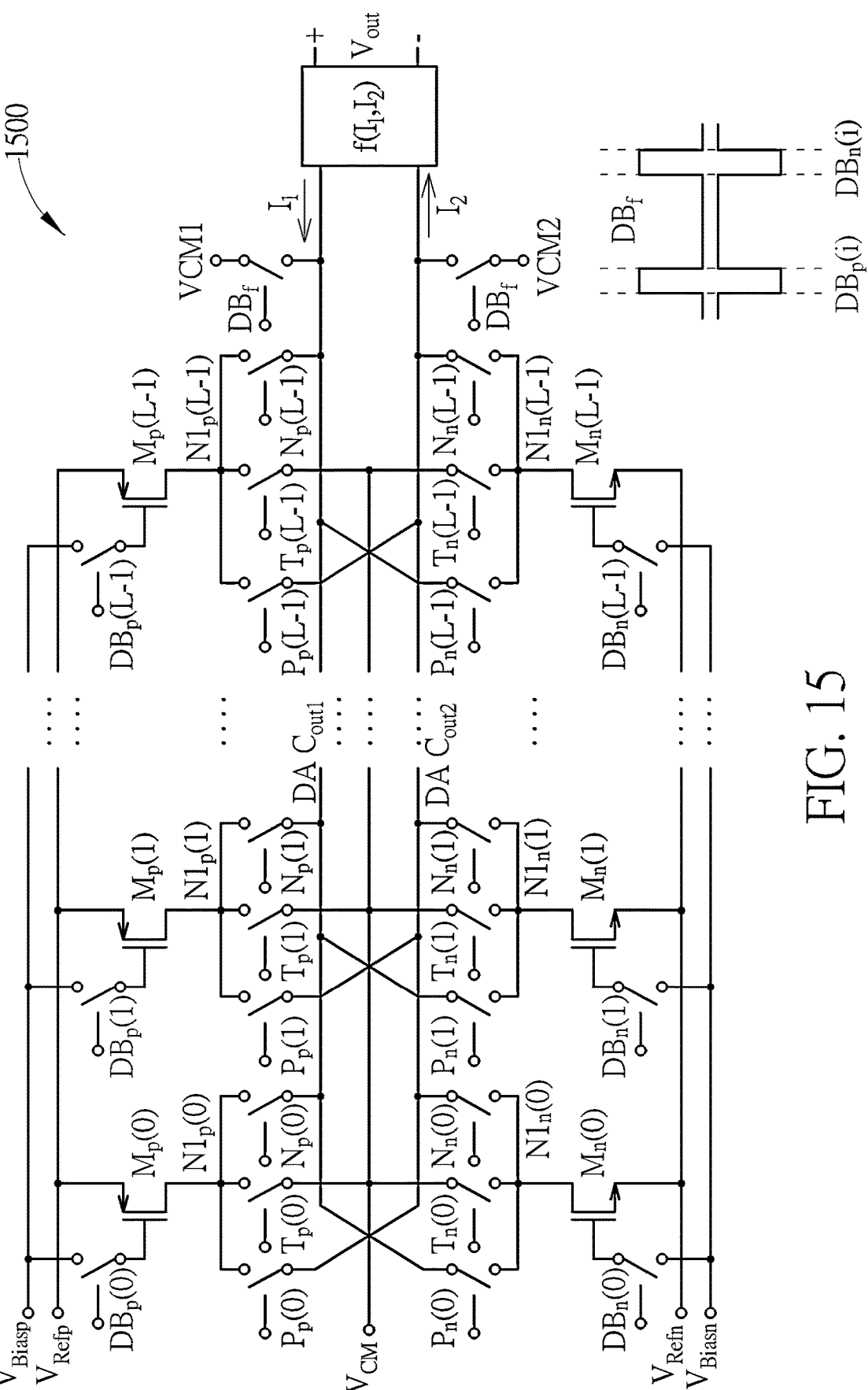
FIG. 15 is a diagram of a DAC cell circuit according to an exemplary embodiment of the present invention.

FIG. 15 is a modification of the DAC circuit illustrated in FIG. 14 and further comprises DB switches coupled between the processing circuit and differential common mode voltages $V_{CM1}$, $V_{CM2}$. In this embodiment, the DB periodic signals will be differential, wherein a first signal is the inverse of the second signal. These extra dead-band switches are used when coupling from inputs of the processing circuit (differential voltage generation circuit) to gates of the tail transistors is significant.

In all the circuits illustrated above, the transistors in each DAC cell may be implemented by NMOS, PMOS, NPN or PNP transistors. Note that cascode architecture in the above circuits is illustrated as comprising two cascode transistors, but any number of transistors may be coupled in cascode, wherein the number may be determined according to specific requirements. As long as a tail transistor of the cascode transistors is coupled to a common node reference voltage and at least one transistor of the cascode transistors has its gate coupled to a dead-band switch, different cascode architectures of a DAC cell will fall within the scope of the present invention. Also, note that the switches $T_{(i)}$ are optional, wherein the presence of the switches makes the DAC cells tri-state and their absence makes them binary.

By providing dead band switches coupled to gates of transistors within a DAC cell, the bias node of a DAC cell can be isolated during data transitions. Further, inter-cell interference between DAC cells within a DAC cell circuit can be reduced. Extra dead-band switches coupled between bias nodes and the DAC outputs can further reduce coupling. The proposed DAC cell structure and DAC cell circuits of the present invention can thereby reduce odd-order harmonics present at an output of a DAC cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DAC cell circuit comprising:
   at least a DAC cell, comprising:
      a first MOSFET having a drain coupled to a first switch for receiving a first current and coupled to a second switch for generating a second current, a source coupled to ground, and a gate coupled to a first bias voltage;
      a capacitor coupled between the gate and the drain of the first MOSFET; and
      a dead-band switch coupled between the gate of the first MOSFET and the bias node;
   wherein the dead-band switch is open during a data transition.

2. The DAC cell circuit of claim 1, comprising:
   a plurality of DAC cells coupled in parallel;
   a voltage generating circuit coupled to the first current and the second current for generating a differential output voltage; and
   a reference voltage coupled to the source of the first MOSFET of each DAC cell.

3. The DAC cell circuit of claim 2, wherein the dead-band switches are controlled by a signal which is periodic with respect to a frequency which is equal to an input data rate of the plurality of DAC cells.

4. The DAC cell circuit of claim 3, further comprising:
   a common mode voltage; and
   a plurality of switches coupled between the common mode voltage and the drain of the first MOSFET of each DAC cell.

5. The DAC cell circuit of claim 4, wherein each DAC cell comprises a second MOSFET coupled in cascode above the first MOSFET, and the DAC cell circuit further comprises a cascode voltage coupled to the gate of the second cascode MOSFET of each DAC cell.

6. The DAC cell circuit of claim 4, wherein each DAC cell comprises a second MOSFET coupled in cascode below the first MOSFET, and the DAC cell circuit further comprises a second bias voltage coupled to a gate of the second cascode MOSFET of each DAC cell.

7. The DAC cell circuit of claim 6, wherein each DAC cell further comprises a second dead-band switch coupled between the second bias voltage and the gate of the second MOSFET.

8. The DAC cell circuit of claim 4, wherein each DAC cell comprises a resistor coupled between the source of the first MOSFET and the reference voltage.

9. A complementary DAC cell circuit comprising two DAC cell circuits of claim 4, coupled together in a mirrored architecture.

10. The complementary DAC cell circuit of claim 9, further comprising differential dead-band switches coupled between the differential output voltage and the common mode voltages.

11. The DAC cell circuit of claim 1, wherein the MOSFET is a PMOS.

12. The DAC cell circuit of claim 1, wherein the transistor is an NMOS.

13. The DAC cell circuit of claim 1, wherein the MOSFET is an NPN transistor.

14. The DAC cell circuit of claim 1, wherein the MOSFET is a PNP transistor.

\* \* \* \* \*